(12) United States Patent
Preisler et al.

(10) Patent No.: US 10,177,045 B2
(45) Date of Patent: Jan. 8, 2019

(54) BULK CMOS RF SWITCH WITH REDUCED PARASITIC CAPACITANCE

(71) Applicant: Newport Fab, LLC, Newport Beach, CA (US)

(72) Inventors: Edward J. Preisler, San Clemente, CA (US); Marco Racanelli, Santa Ana, CA (US); Paul D. Hurwitz, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/941,234

(22) Filed: Mar. 30, 2018

(65) Prior Publication Data

US 2018/0323115 A1  Nov. 8, 2018

Related U.S. Application Data

(62) Division of application No. 15/587,969, filed on May 5, 2017.

(51) Int. Cl.
| | |
|---|---|
| *H01L 27/085* | (2006.01) |
| *H01L 21/8238* | (2006.01) |
| *H01L 29/06* | (2006.01) |
| *H01L 21/266* | (2006.01) |
| *H01L 21/762* | (2006.01) |
| *H01L 27/092* | (2006.01) |

(52) U.S. Cl.
CPC .... *H01L 21/823878* (2013.01); *H01L 21/266* (2013.01); *H01L 21/76224* (2013.01); *H01L 21/823892* (2013.01); *H01L 27/092* (2013.01); *H01L 29/0646* (2013.01)

(58) Field of Classification Search
CPC ............. H01L 21/266; H01L 21/76224; H01L 21/823878; H01L 21/823892; H01L 27/092; H01L 27/1104; H01L 29/0646
USPC ................ 257/329, 330, 334, 372, E21.345, 257/E29.262
See application file for complete search history.

(56) References Cited

U.S. PATENT DOCUMENTS

| | | | | |
|---|---|---|---|---|
| 2004/0113204 A1* | 6/2004 | Tsuchiko | ............ | H01L 27/0629 257/341 |
| 2013/0072004 A1* | 3/2013 | Tsuchiko | ............ | H01L 21/8222 438/492 |
| 2013/0093017 A1* | 4/2013 | Ko | .................... | H01L 29/66659 257/343 |

\* cited by examiner

*Primary Examiner* — Brook Kebede
(74) *Attorney, Agent, or Firm* — Bever, Hoffman & Harms, LLP

(57) ABSTRACT

Bulk CMOS RF switches having reduced parasitic capacitance are achieved by reducing the size and/or doping concentration of the switch's N-doped tap (N-Tap) element, which is used to conduct a bias voltage to a Deep N-Well disposed under each switch's P-Type body implant (P-Well). Both the P-Well and the N-Tap extend between an upper epitaxial silicon surface and an upper boundary of the Deep N-well. A low-doping-concentration approach utilizes intrinsic (lightly doped) N-type epitaxial material to provide a body region of the N-Tap element, whereby an N+ surface contact diffusion is separated from an underlying section of the Deep N-well by a region of intrinsic epitaxial silicon. An alternative reduced-size approach utilizes an open-ring deep trench isolation structure that surrounds the active switch region (e.g., the Deep N-well and P-Well), and includes a relatively small-sized N-Tap region formed in an open corner region of the isolation structure.

9 Claims, 8 Drawing Sheets

BULK CMOS RF SWITCH WITH REDUCED PARASITIC CAPACITANCE

RELATED APPLICATION

The present application is a divisional of commonly owned U.S. patent application Ser. No. 15/587,969, filed May 5, 2017 and entitled BULK CMOS RF SWITCH WITH REDUCED PARASITIC CAPACITANCE.

BACKGROUND OF THE INVENTION

Field of the Invention

The present invention relates to a RF switches, and more particular to bulk RF switches fabricated using CMOS or BiCMOS fabrication techniques.

Related Art

RF Switches built from N-Type Field-Effect Transistors (NFETs) on bulk Silicon substrates using Complementary Metal-Oxide Semiconductor (CMOS) or BiCMOS processing techniques (herein referred to as "bulk CMOS RF switches) suffer from large parasitic capacitances due to the various P-N junctions that are inherent in conventional RF switches configurations. These parasitic capacitances manifest themselves in the form of lower RF impedance between the device and ground that leads to poor isolation (i.e., current leakage) of the switch in the off state (referred to as $C_{off}$).

FIGS. 8(A) and 8(B) are plan and cross-sectional side views showing a conventional NFET 50, which is representative of a typical conventional bulk CMOS RF switch. As indicated in FIG. 8(B), NFET 50 is formed on a base structure including a substrate 51 and an epitaxial layer 52. Epitaxial layer 52 is typically initially formed as a lightly N-doped epitaxial (N-epi) material on a p-type monocrystalline silicon substrate 51 using known techniques, and is then subjected to known doping processes such that the P-type or N-type dopants are diffused into corresponding regions of epitaxial 52 in order to change the electrical characteristics of these regions as described below.

As indicated in FIG. 8(A), NFET 50 includes functional structures fabricated in and over a volume of epitaxial layer 52 that is generally surrounded by field isolation 53, and located over an N-Type isolation implant (Deep N-Well) 54. For descriptive purposes, the volume of epitaxial layer 52 occupied by regions of NFET 50 include a first (lower) epi region 52-1, a second epi region 52-2 located over a first portion of first epi region 52-1, and a third portion 52-3 located over a second portion of first epi region 52-1. Field isolation 53 is typically formed using known shallow trench isolation techniques, but may include other isolation structure types. The various sections of field isolation 53 surrounding NFET 50 are also identified for descriptive purposes as end sections 53-1 and 53-2 (i.e., aligned in the X-axis direction), and side sections 53-3 and 53-4 (i.e., aligned in the X-axis direction). An intermediate field isolation section 53-5 is aligned parallel to end sections 53-1 and 53-2, and separates second epi region 52-2 from third epi region 52-3. Referring to FIG. 8(B), field isolation 53 extends into epitaxial layer 52 from an upper surface 52U, but does not extend entirely through epitaxial layer 52. Deep N-Well 54 is formed at the horizontal interface of epitaxial layer 52 and substrate 51 such that a first portion of the N-type dopant used to generate Deep N-well 54 occupies first epi region 52-1, and a second portion of the N-type dopant is diffused into an upper section of substrate 51.

NFET 50 generally includes functional structures formed in a P-Type NFET body implant (P-Well) 55, and also a N-Type body implant (N-Tap) element 56, and a P-type body implant (N-Tap) element 59. P-well 55 is formed by implanting a P-type dopant into second epi region 52-2 using a high-energy diffusion process such that P-Well 55 extends from an upper boundary 54U of Deep N-Well 54 to upper surface 52U of epitaxial layer 52, and from intermediate field isolation section 53-5 to end field isolation section 53-2. A polycrystalline silicon (polysilicon or poly) gate structure G is formed over P-well 55 using known techniques, and then a source region S and a drain region D are formed in corresponding portions of P-well 55 using shallow N-type implants that are separated by a channel region CH, and a base contact B is formed in another corresponding portion of P-well 55 using a shallow P-type implant. Other functional portions and features of NFET 50, some of which being illustrated in FIG. 8(B), are omitted from mention for brevity. N-Tap element 56 includes an N-type contact region C and an N-type dopant 57 disposed in third epi region 52-3. N-type dopant 57 implanted into third epi region 52-3 using a high-energy diffusion process such that N-type dopant 57 extends from an upper boundary 54U of Deep N-Well 54 to upper surface 52U of epitaxial layer 52. Contact region C is formed simultaneously with the source and drain regions using shallow N-type implants, and is at upper surface 52U between end field isolation section 53-1 and intermediate field isolation section 53-5. P-Tap element 59 is formed simultaneously with P-Well 55, and is located outside the periphery of field isolation 53 (e.g., to the left of end field isolation section 53-1 in FIG. 8(B)).

Base contact B, N-Tap element 56 and P-Tap element 59 receive bias voltages that enhance the performance of NFET 50 by way of isolating the functional structures during operation. N-Tap 56 serves to facilitate maintaining Deep N-Well 56 at a desired voltage level (potential) during operation by way of conducting an N-well bias voltage $V_{bias-DNW}$ from highly N-doped (N+) N-Tap surface contact implant C to Deep N-Well 54. Intermediate field isolation section 53-5 is disposed above the vertical interface between N-Tap epi region 52-3 and P-Well 55 and serves to isolate N-Tap contact implant C from highly P-doped (P+) body contact implant B, which is also formed at upper epitaxial layer surface 52U and serves as a contact point for an applied body bias voltage $V_{bias-PW}$ that maintains P-Well 55 at a desired voltage level during operation. Referring to the left side of FIG. 8(B), external P-doped implant (P-Tap) element 59 forms another "tap" region that connects substrate 51 to upper epitaxial layer surface 52U. Note that P-Tap element 59 is separated from N-Tap 56 by a retained (i.e., lightly N-doped) portion 52R of intrinsic N-epi material, which is located under end field isolation section 53-1 and therefore protected from doping during formation of N-Tap element 56 and P-Tap element 59. With the bias voltages applied as mentioned above, NFET 50 is switched into a closed (on) operating state (i.e., such that current flows from source implant S and drain implant D through channel region CH) by way of applying a sufficiently high gate voltage to gate structure G, and NFET 50 is switched into an open (off) operating state, in which no current flows in channel region CH, by way of applying a sufficiently low gate voltage to gate structure G.

As mentioned above, the configuration of conventional NFET 50 produces various parasitic capacitances that lead to poor isolation of NFET 50 in its off state. For descriptive purposes, these various parasitic capacitances are represented in FIG. 8(B) by capacitors C1 to C5, where parasitic capacitance C1 is a first vertical P-N junction capacitance formed by the interface between P-Well 55 and Deep N-Well 54, parasitic capacitance C2 is second a vertical P-N junction capacitance formed by the interface between Deep N-Well 54 and P-type substrate 51, parasitic capacitance C3 is a lateral (horizontal) P-N junction capacitance formed by the interface between P-Well 55 and N-Tap element 56, parasitic capacitance C4 is a peripheral overlap P-N junction capacitance generated between an overlap region 52O of third epi region 52-3 (i.e., part of N-Tap element 56) and P-type substrate 51 and created by an that typically occurs in conventional layouts, and parasitic capacitance C5 is a lateral (peripheral) P-N junction capacitance between N-Tap 56 and P-Tap 59. When utilized as a bulk CMOS RF switch, each of parasitic capacitances C1 to C5 contributes to generate a total parasitic capacitance to ground. This parasitic capacitance leads to poor isolation when NFET 50 is in an off state, causing undesirable leakage of an RF signal from the functional structures to ground. This reduces switch performance and increases battery consumption in mobile devices.

In a BiCMOS process the "native" silicon regions that are not implanted in any way (identified by regions 52R in FIG. 8(B)) are usually lightly doped n-type epitaxially grown silicon. In contrast, in a standard CMOS process the native silicon regions are typically part of the original silicon substrate, usually lightly-doped p-type.

What are needed are improved bulk CMOS RF switches that exhibit improved $R_{on}$-$C_{off}$ characteristics over those exhibited by conventional bulk CMOS RF switch configurations. More specifically, what is needed is a cost-effective and reliable method for fabricating (manufacturing) bulk CMOS RF switches that achieve decreased $C_{off}$ by way of reducing each switch's total parasitic capacitance without significantly increasing the switch's $R_{on}$, without significantly changing the switch's footprint (i.e., chip-area size), and without requiring expensive modifications to existing CMOS and BiCMOS fabrication flows.

SUMMARY

The present invention provides improved bulk CMOS RF switches and associated fabrication methodologies that achieve improved $R_{on}C_{off}$ characteristics by way of reducing the lateral parasitic capacitances generated between adjacent N-type and P-type epitaxial regions. According to an aspect of the present invention, the lateral P-N junction parasitic capacitance reduction is achieved by way of either reducing the doping concentration in the N-type epitaxial region utilized by the N-Tap element, or reconfiguring the N-Tap element such that the P-N interface boundary area is significantly reduced. By reducing lateral P-N junction parasitic capacitance using these techniques, the present invention facilitates the production of bulk CMOS RF switches exhibiting reduction in total parasitic capacitance (i.e., in comparison to convention bulk CMOS RF switches), thereby-achieving improved $R_{on}$-$C_{off}$ characteristics.

According to an exemplary embodiment of the present invention, a method for fabricating a bulk CMOS RF switch includes forming or otherwise procuring a base structure including an intrinsic lightly N-doped epitaxial (N-epi) layer having a Deep N-Well, and masking or otherwise preventing N-type dopants from entering the N-Tap element's epitaxial region during subsequent high-energy N-type doping processing utilized by a CMOS or BiCMOS fabrication flow such that the finalized N-Tap element includes a body region comprising retained (i.e., not significantly changed) intrinsic N-epi material that is located between a shallow surface contact implant (diffusion) and the Deep N-Well. As noted above, the epitaxial region of N-Tap elements in conventional bulk CMOS RF switches typically include high-energy N-type doping in order to conduct a bias voltage from the surface contact implant through the epitaxial region to the underlying Deep N-Well. The present inventors determined that reducing the N-type doping concentration in the N-Tap element's body region significantly reduces total parasitic capacitance (i.e., by way of minimizing the lateral parasitic capacitances between the N-doped and P-doped epitaxial regions) without significantly affecting the transmission of bias voltage from the surface contact implant to the underlying Deep N-Well. Moreover, the present inventors determined that altering the fabrication process such that body region comprises intrinsic N-epi material having a resistivity in the range of 0.5 to 2 ohm-cm provides sufficient electrical conduction between the N-Tap element's highly N-doped surface contact implant and the Deep N-Well (DNW), particularly in BiCMOS processes. A benefit of forming the N-Tap element's body region using intrinsic N-epi material is that the desired reduction in N-type doping concentration is achieved without requiring changes to an established BiCMOS fabrication flow (i.e., other than changing the corresponding mask region to prevent high-energy N-type doping in the N-Tap's epitaxial region), and can be implemented without changing the size or position of any of the various diffusions and structures that are otherwise utilized in conventional bulk CMOS RF switches. Accordingly, the above-described embodiment provides a low-cost method for fabricating bulk CMOS RF switches that achieve decreased $R_{on}$-$C_{off}$ characteristics.

According to another embodiment of the present invention, a bulk CMOS RF switch includes an open-ring deep trench (DT) isolation structure that substantially surrounds each switch's active region, and reduced-size N-Tap element disposed in a gap (open corner) region of the open-ring isolation structure. Similar to the first embodiment, each bulk CMOS RF switch includes a transistor element including functional switch elements disposed on a P-Well formed over a first portion of a Deep N-Well. Each switch's open-ring DT isolation structure includes contiguous DT sections that substantially surround the P-Well, where each DT section extends entirely through the epitaxial layer. In one embodiment, the open-ring DT isolation structure forms a rectangular, three-cornered rectangular arrangement in which the gap region is disposed in an open corner of the arrangement. The open-ring DT isolation structure functions to reduce the peripheral (lateral) parasitic capacitance between the Deep N-Well and the P-doped epi material surrounding each switch. The reduced size N-Tap element, in combination with the open ring DT isolation structure, essentially eliminates the lateral (peripheral) P-N junction parasitic capacitance and the peripheral overlap P-N junction parasitic capacitance, whereby only the vertical parasitic capacitances and the lateral (peripheral) P-N junction parasitic capacitance) remain. A further advantage of this technique is that it allows closer packing of adjacent switches because the DT ring structure reduces the need for a wide separating region between adjacent switches, which was required in conventional arrangements to reduce the lateral P-N junction capacitances. Moreover, the modified approach does not require substantial changes to the established CMOS or BiCMOS fabrication flow (i.e., when the deep trench formation process is part of the established fabrication flow). Accordingly, the above-described embodiment provides a bulk CMOS RF switch that achieves increased $C_{off}$ without significantly changing the switch's size (chip area) and without requiring significant modifications to existing CMOS or BiCMOS fabrication flows.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to improved bulk CMOS RF switches and associated fabrication methods. The following description is presented to enable one of ordinary skill in the art to make and use the invention as provided in the context of a particular application and its requirements. As used herein, directional terms such as "above", "below", "upper", "lower", "vertical", and "horizontal" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
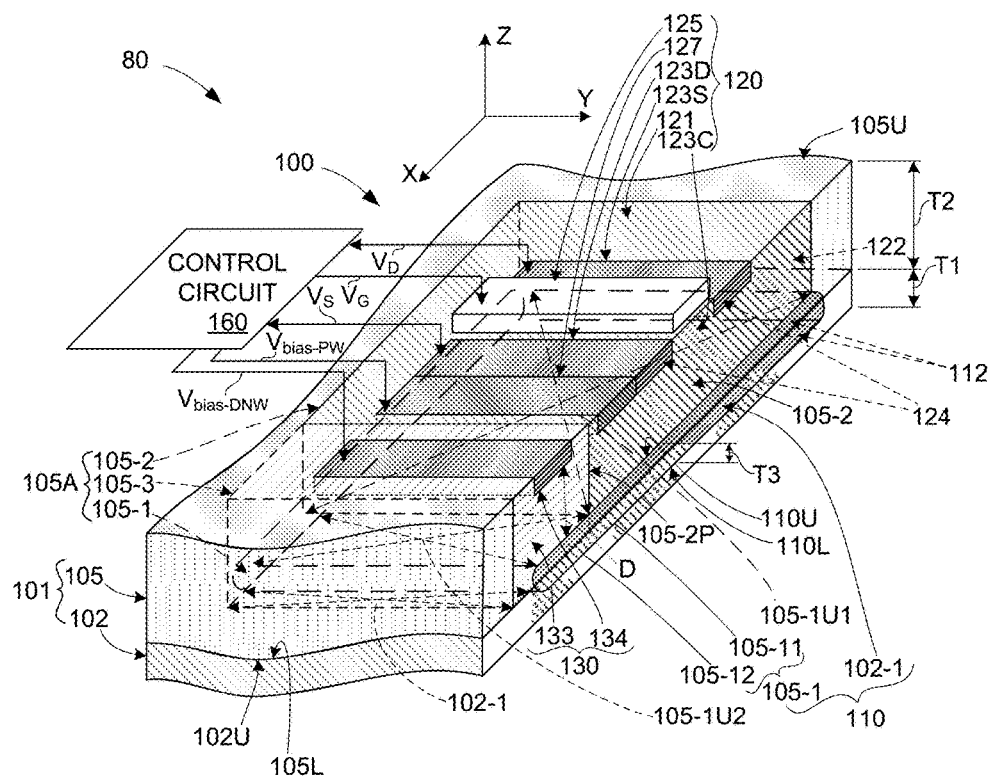
FIG. 1 is a perspective view showing a simplified bulk CMOS RF switch according to an embodiment of the present invention.

FIG. 1 shows a partial integrated circuit (IC) 80 fabricated on a base structure 101 using a CMOS or BiCMOS process flow. Base structure 101 includes an epitaxial silicon layer 105 formed on an upper surface 102U of a semiconductor substrate 102 using known techniques. In an exemplary embodiment, semiconductor substrate 102 is a P-doped monocrystalline silicon structure having a nominal thickness T1 of approximately 750 microns (μm) and having an intrinsic P-type doping concentration that produces a resistivity in the range of 1 to 1000 ohms per centimeter (ohm-cm). Epitaxial layer 105 has nominal thickness T2 in the range of 0.25 μm to 2 μm, and is initially formed with an intrinsic (i.e., as-deposited/formed) doping concentration that produces a resistivity in the range of 0.5 to 2 ohms-cm.

IC 80 includes at least one bulk CMOS RF switch 100 and other circuitry (e.g., a control circuit 160) that are simultaneously fabricated on base structure 101 using the CMOS or BiCMOS process flow mentioned above. The additional circuitry of IC 80 may include additional bulk CMOS switches that are fabricated simultaneously with bulk CMOS RF switch 100 in the manner described below. Control circuit 160 is formed using CMOS transistors (e.g., NMOS and PMOS transistors) that are operably configured control the operation of bulk CMOS RF switch 100 in the manner described below. Control circuit 160 and additional circuit structures (e.g., power control and test circuits, not shown) of IC 80 are fabricated on base structure 101 using the same processes utilized to fabricate bulk CMOS RF switch 100 as those described below.

Bulk CMOS RF switch 100 is formed in and over a corresponding active switch region 105A of epitaxial layer 105. Active switch region 105A includes three contiguous volumetric portions (regions) referred to herein as first epitaxial (epi) region 105-1, second epi region 105-2 and third epi region 105-3, where boundaries between these three volume portions delineated by significant changes is doping type/concentration. First epi portion 105-1 is a thin, flat region of epitaxial layer 105 that is located immediately above upper surface 102U of substrate 102, extends the entire width (i.e., measured in the Y-axis direction) of active switch region 105A, and extends almost the entire length (i.e., measured in the X-axis direction) of active switch region 105A. Second epi region 105-2 is disposed between the upper epitaxial surface 105U and a first upper boundary region 105-1U1 of first epitaxial layer portion 105-1 such that second epi region 105-2 extends the entire width of active switch region 105A, and is entirely located over a (first epitaxial layer) portion 105-11 of first epitaxial region 105-1. Third epi region 105-3 is disposed between the upper epitaxial surface 105U and a second upper boundary region 105-1U2 of the first epitaxial layer portion 105-1 that is defined by a (second epitaxial layer) portion 105-12 of first epitaxial region 105-1, and third epi region 105-3 extends past an end of first epi region 105-1 and over a section 102U-1 of upper substrate surface 102U. Referring briefly to FIG. 3(B), which shows a bulk CMOS RF switch 100A that is similar to switch 100 of FIG. 1, a boundary 105-2P is formed between second epi region 105-2 and third epi region 105-3 where the dominant doping type changes from P-type to N-type.

Figure 8A:
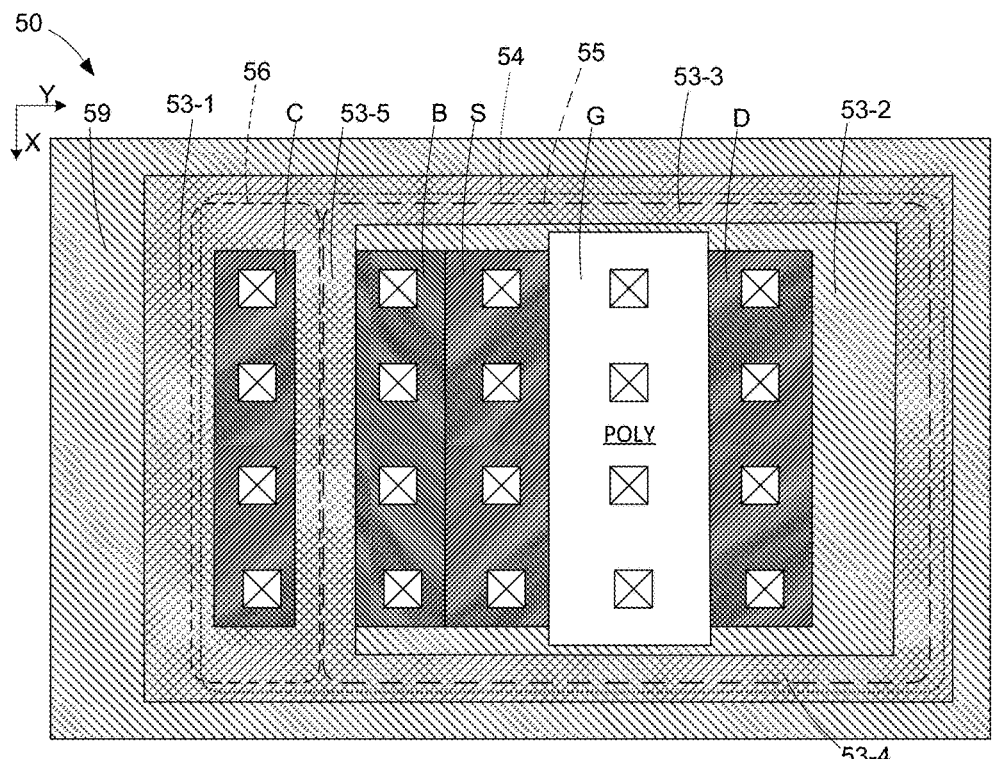
FIGS. 8(A) and 8(B) are top and cross-sectional views showing a conventional bulk CMOS RF switch.
Figure 8B:
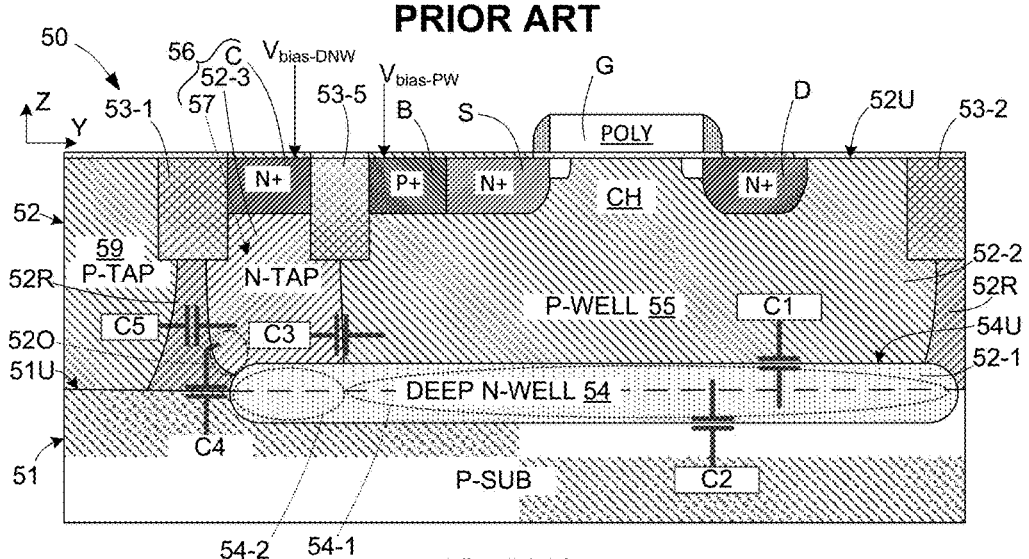

Referring again to FIG. 1, bulk CMOS RF switch 100 is similar to the configuration utilized by conventional NFET switch 50 (see, e.g., FIGS. 8(A) and 8(B)) in that switch 100 generally includes a Deep N-Well 110, a functional switch (transistor) element 120 and an N-Tap element 130 that are formed in and over an active switch region 105A.

Referring to the lower portion of FIG. 1, Deep N-Well 110 is formed and configured in a manner similar to that utilized in conventional NFET switch 50 (see, e.g., FIGS. 8(A) and 8(B)). Specifically, Deep N-Well 110 includes a (first) N-type dopant 112 that is partially disposed in (i.e., diffused into) first epi region 105-1, and partially disposed in a thin, flat (first) region 102-1 of substrate 102 that is disposed directly below first epi region 105-1. That is, Deep N-Well 110 extends across the interface between lower surface 105L of epitaxial layer 105 and upper surface 102U of substrate 102, whereby an upper portion of Deep N-Well 110 is formed in first epi portion 105-1, and a lower portion of Deep N-Well 110 is formed in located immediately below upper surface 102U of substrate 102. Deep N-Well 110 has an overall nominal thickness T3 (i.e., Z-axis distance between a horizontal upper boundary 110U and a horizontal lower boundary 110L) in the range of about 2 µm to 4 µm, with N-type dopant 112 having a nominal concentration in the range of $1\times10^{16}$ to $1\times10^{18}$ atoms per cubic centimeter ($cm^{-3}$). Note that Deep N-well 110 is formed such that a majority of epitaxial layer 105 is disposed between upper boundary 110U of N-well 110 and upper surface 105U of epitaxial layer 105 (i.e., a vertical Y-axis thickness of P-Well epi portion 105-2 is greater than a vertical thickness of N-Well epi portion 105-1).

Transistor (switch) element 120 includes N-type source and drain contact diffusions 123S and 123D and a P-type body contact diffusion 127 formed in a P-Well 121, and a polysilicon gate structure 125 formed over epitaxial layer 105. P-Well 121 includes a (first) P-type dopant 122 disposed in second epi region 105-2 such that P-Well 121 is entirely located over first epitaxial layer portion 105-11, where P-type dopant 122 has a typical doping concentration inside second epitaxial region 105-2. N-type source contact diffusion 123S and N-type drain contact diffusion 123D are shallow diffusions formed by a (second) N-type dopant 124 having a typical doping concentration that is diffused into corresponding regions of P-Well 121 adjacent to upper epitaxial surface 105U in a spaced-apart configuration such that a channel region 123C, which is formed by a portion of P-Well 121, is located between source contact diffusion 123S and drain contact region 123D. Polysilicon gate structure 125 disposed on a gate oxide layer 126, which is formed on the upper epitaxial surface 105U, such that polysilicon gates structure 125 is located over channel region 123C. P-type body contact diffusion 127 is formed by a (second) P-type dopant 128 diffused into P-Well 121 adjacent to upper epitaxial surface 105U and between N-type source contact diffusion 123S and third epi region 105-3. P-Well epi portion 105-2 is entirely disposed over (first) portion 105-11 of epitaxial layer 105 and extends from upper boundary region 105-1U1 to upper surface 105U of epitaxial layer 105. That is, P-Well epi portion 105-2 is entirely disposed over Deep N-Well 110.

N-Tap element 130 is similar to conventional N-Tap element 56 (see, e.g., FIG. 8(B)) in that N-Tap element 130 includes a shallow (third) N-type contact diffusion 134 formed in third epi region 105-3 adjacent to the upper epitaxial surface 105U. N-Tap element 130 differs from conventional N-Tap element 56 in that body region 133, which is implemented in (i.e., occupies a portion of) third epi region 105-3, comprises intrinsic (or lightly N-doped) epitaxial silicon material. In a presently preferred embodiment, as described below with reference to FIG. 2, body region 133 of N-Tap element 130 is formed by way of omitting or preventing the diffusion of N-type dopants into third epi region 105-3 during fabrication, whereby body region 133 maintains the intrinsic N-type dopant concentration, whereby body region 133 is characterized by having a resistivity in the range of 0.5 to 2 ohms-cm, which is substantially higher than conventional N-Tap region 52-3 of conventional NFET 50 (see FIG. 8(B)). An advantage to implementing body 133 using intrinsic epitaxial silicon material is that this approach avoids changes to the established CMOS or BiCMOS process flow, thereby minimizing costs and maximizing product yields. In other embodiments, a special N-type doping process may be added to provide the light N-type doping concentration set forth herein (i.e., when insufficient N-type doping concentration is provided by the intrinsic epitaxial silicon material).

Figure 2:
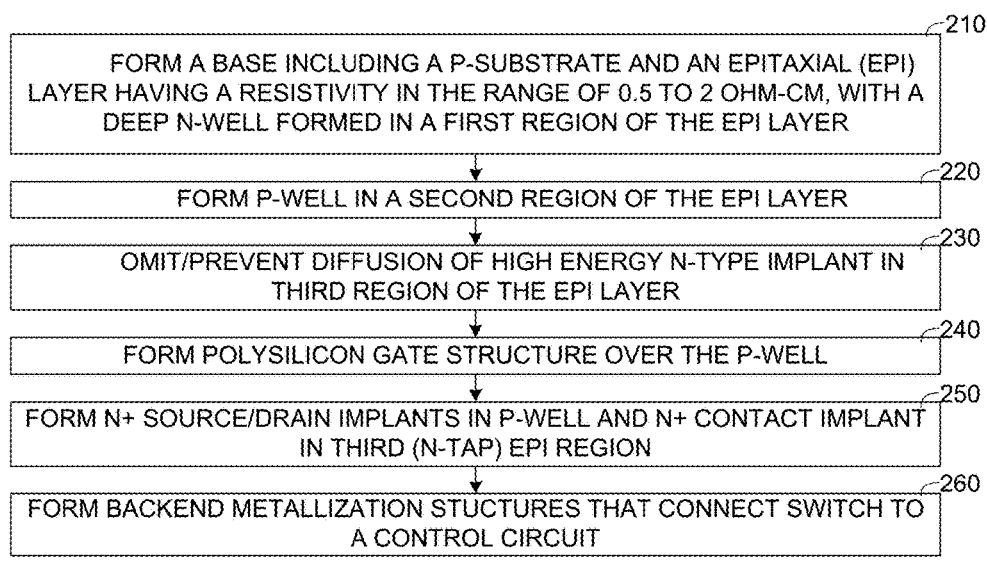
FIG. 2 is a flow diagram showing a method for producing a bulk CMOS RF switch according to another embodiment of the present invention.

Referring to the left side of FIG. 1, control circuit 160 is configured to transmit a (first) N-Well bias voltage $V_{bias\text{-}DNW}$ to (third) N-type contact diffusion 134 and a (second) P-body bias voltage $V_{bias\text{-}PW}$ to P-type body contact diffusion 127 during the operation of bulk CMOS RF switch 100. Control circuit 160 is also configured to control the operation of switch 100 by way of switch signals $V_G$, $V_S$ and $V_D$, which are applied to or measured from polysilicon gate structure 125, source contact diffusion 123S and drain contact diffusion 123D using known techniques. According to another aspect of the invention, body region 133 of N-Tap element 130 is configured (e.g., by way of a combination of the intrinsic N-doping concentration and an offset distance D from contact diffusion 134 to first upper boundary region 105-1U1 of first epitaxial layer portion 105-1) such that a sufficient portion of N-Well bias voltage $V_{bias\text{-}DNW}$ is passed from contact diffusion 134 to Deep N-Well 110 to maintain Deep N-Well 110 at a predetermined (first) bias voltage level during operation of transistor element 120. That is, N-Well bias voltage $V_{bias\text{-}DNW}$ is adjusted as needed to compensate for any increased impedance caused by fabricating body region 133 using intrinsic (i.e., lightly N-doped) epitaxial material. This difference should be negligible given the typical voltages applied to the DNW (several volts) and the doping levels discussed above. In a similar manner, second P-body bias voltage $V_{bias\text{-}PW}$ maintains P-Well 121 at a predetermined (second) bias voltage level during operation of transistor element 120. FIG. 2 is a flow diagram showing a method for fabricating bulk CMOS RF switch 100. Specific structures referenced by number below are shown in FIG. 1. Referring to block 210 in FIG. 2, the method begins with forming base structure 101 by forming epitaxial silicon layer 105 over substrate 102 with Deep N-well 110 formed in first epi region 105-1 (i.e., above the interface formed by lower epitaxial surface 105L and upper substrate surface 102U), with epitaxial layer 105 having the intrinsic (nominal) N-type doping concentration mentioned above. Referring to block 220 in FIG. 2, P-well 121 is then formed by implanting first P-type dopant 122 into second epi region 105-2. Referring to block 230, according to an aspect of the present invention, diffusion of high-energy (body) N-type implant is omitted or prevented (e.g., by way of disposing a mask over the entire active switch region 105A during the corresponding N-type implant) such that third epitaxial region 105-3 maintains the (first) intrinsic nominal N-type doping concentration mentioned above. Polysilicon gate structure 125 is then formed over P-well 121 (block 240), and then (second) N-type and P-type implants are performed (block 250) during which shallow P-body contact diffusion 127 and spaced-apart source and drain contact diffusions 123S and 123D are formed in P-Well 121, and (third) contact diffusion 134 is formed in third epi region 105-3. As with the shallow source/drain diffusions, (third) N-type contact diffusion 134 is formed such that a distance D separates contact diffusion 134 from second upper boundary region 105-1U2 of second epi layer portion 105-12, where the distance D is occupied by body region 133 of N-Tap element 130 (i.e., by intrinsic epitaxial material). Finally, as indicated in block 260, backend metallization structures are formed using known techniques including metal via structures connected to contact diffusions 123S, 123D and 134, while body region 133 is maintained as intrinsic lightly N-doped epitaxial material. In one embodiment, forming the backend metallization structures includes forming interconnect structures between N-type contact diffusion 134 and control circuit 160 such that bias voltage $V_{bias\text{-}DNw}$ generated by control circuit 160 is supplied to Deep N-Well 110 by way of being applied to N-type contact diffusion 134 during operation of transistor element 120. Selected portions of the flow diagram of FIG. 2 are described in additional detail below with reference to FIGS. 4(A) to 4(G).

Figure 3A:
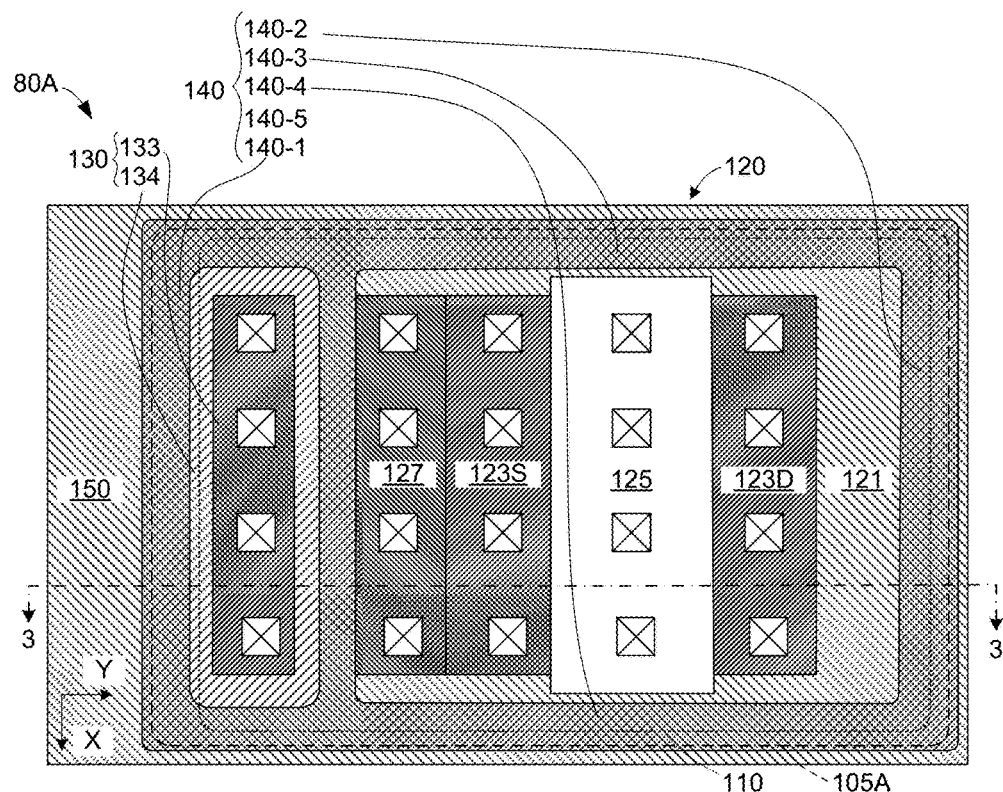
FIGS. 3(A) and 3(B) are simplified top and cross-sectional side views showing a bulk CMOS RF switch according to another embodiment of the present invention.
Figure 3B:
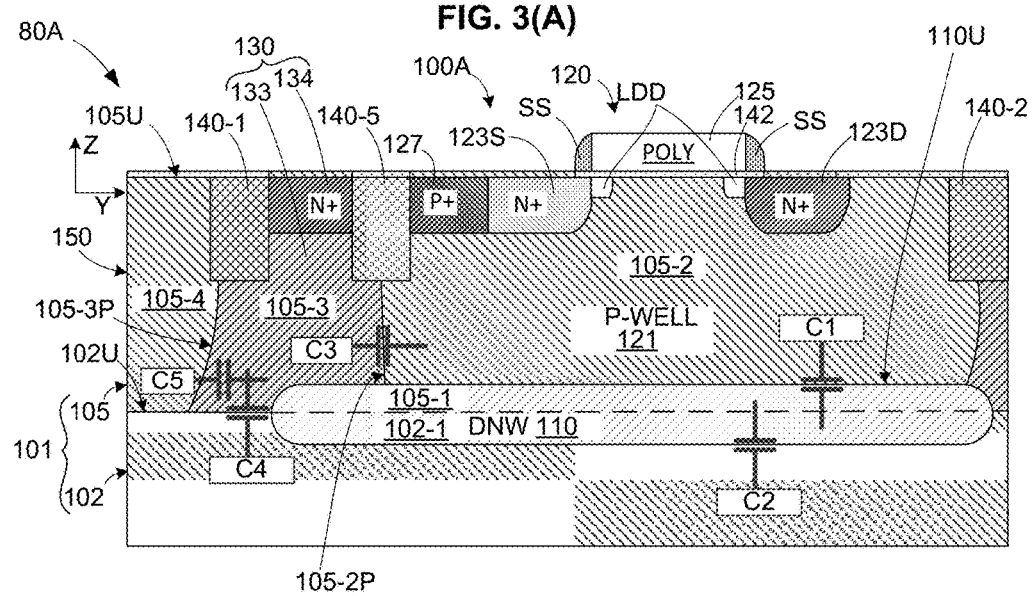

FIGS. 3(A) and 3(B) are top plan and cross-sectional side views showing a bulk CMOS RF switch 100A according to another embodiment of the present invention. Bulk CMOS RF switch 100A is similar to switch 100 (FIG. 1), but includes field isolation 140 and a P-Tap element 150 that were omitted from FIG. 1 for descriptive purposes. That is, bulk CMOS RF switch 100A includes Deep N-Well 110, transistor element 120 and N-Tap element 130, which are configured substantially as described above with reference to FIG. 1. Accordingly, these elements are identified by the same reference numbers as those utilized with reference to FIG. 1, and a full description of these elements is omitted below for brevity.

Referring to FIG. 3(A), field isolation 140 includes peripheral field isolation sections 140-1 to 140-4 and an intermediate isolation section 140-5. The peripheral sections of field isolation 140 include end sections 140-1 and 140-2 that extend in the X-axis direction, and side sections 140-3 and 140-4 that extend in the Y-axis direction. As indicated in FIG. 3(A), active switch region 105A of switch 100, which includes epitaxial regions 105-1 to 105-3 (shown in FIG. 3(B), is generally bounded (surrounded by) peripheral field isolation sections 140-1 to 140-4. Intermediate isolation section 140-5, which extends parallel to end sections 140-1 and 140-2, is disposed between (second) epi region 105-2 (i.e., P-Well 121) and (third) epi region 105-3 (i.e., N-Tap element 130).

Referring to FIG. 3(B), P-Tap element 150 is formed in a (fourth) epi region 105-4 of epitaxial layer 105 that is disposed outside the periphery of field isolation 140 (i.e., to the left of end section 140-1 as indicated in FIG. 3(B)) such that said P-Tap element 150 is not formed over Deep N-Well 110, whereby P-Tap element 150 provides a P-doped region that extends entirely through epi layer 105 from upper surface 105U to upper surface 102U.

FIGS. 4(A) to 4(G) depict a simplified fabrication process used to produce bulk CMOS RF switch 100A (FIGS. 3(A) and 3(B)) using a methodology similar to that introduced above with reference to FIG. 2.

Figure 4A:
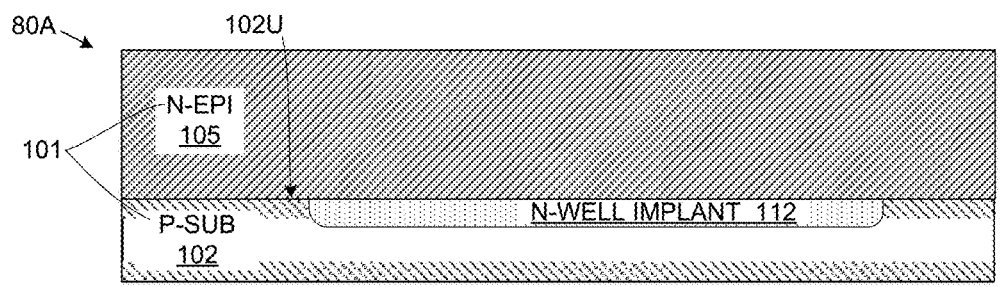
FIGS. 4(A), 4(B), 4(C), 4(D), 4(E), 4(F) and 4(G) are simplified cross sectional views showing the bulk CMOS RF switch of FIGS. 3(A) and 3(B) during various stages of fabrication in accordance with the methodology of FIG. 2.
Figure 4B:
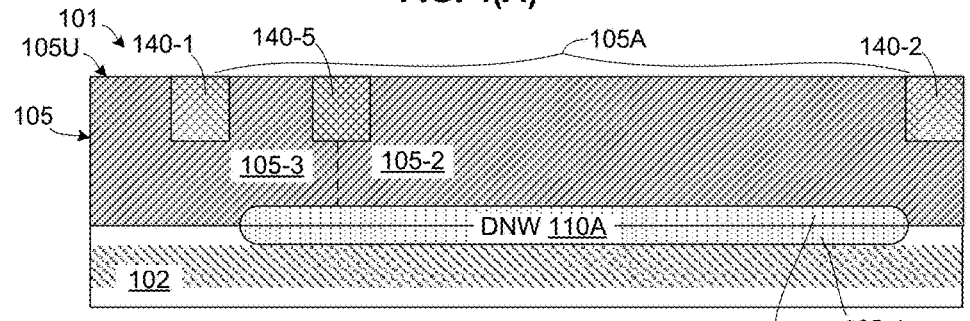

FIGS. 4(A) and 4(B) depict the formation of base structure 101 such that Deep N-well 110 is formed at an interface between P-doped substrate (P-SUB) 102 and N-doped epitaxial (N-EPI) layer 105. Referring to FIG. 4(A), prior to formation of N-epi layer 105, N-type dopant 112 is implanted through upper surface 102U of substrate 102 using a suitable mask (not shown) such that dopant 112. As indicated in FIG. 4(B), at some point subsequent to the formation of N-epi layer 105, sufficient heat is applied to base structure 101 to cause migration (diffusion) of N-type dopant 112 both upward into N-epi layer 105 and downward into substrate 102, whereby Deep N-Well 110A is formed with the requisite upper portion formed in first epi region 105-1 and lower portion formed in substrate region 102-1. In other embodiments, base structure 101 configured as shown in FIG. 4(B) may be generated using alternative techniques.

Next, active area lithography is performed to provide field isolation for the RF switches. Referring to FIG. 3(A)) field isolation 140 includes end sections 140-1 and 140-2 and side sections 140-3 and 140-4 that form a peripheral field isolation around active switch region 150A, and intermediate section 140-5 that extends between epitaxial regions 105-2 and 105-3. Referring to the upper portion of FIG. 4(B), in a preferred embodiment, the peripheral field isolation (i.e., as indicated by end sections 140-1 and 140-2) and intermediate field isolation section 140-5 are generated using shallow trench isolation (STI) techniques, where trenches are first etched into upper surface 105U of N-epi layer 105, and then the trenches are filled with a suitable isolation material (e.g., silicon dioxide) using known techniques. In other embodiments, field isolation structures may be formed using local oxidation of silicon (LOCOS) or poly buffered local oxidation of silicon (PBLOCOS) techniques. As mentioned above, the end and side sections of peripheral field isolation 140 are substantially positioned over (i.e., aligned in the Z-axis direction with) a peripheral edge of Deep N-well 110A, and surround portion of the N-epi layer 105 into which the functional switch structures and N-Tap element will be subsequently formed.

Figure 4C:
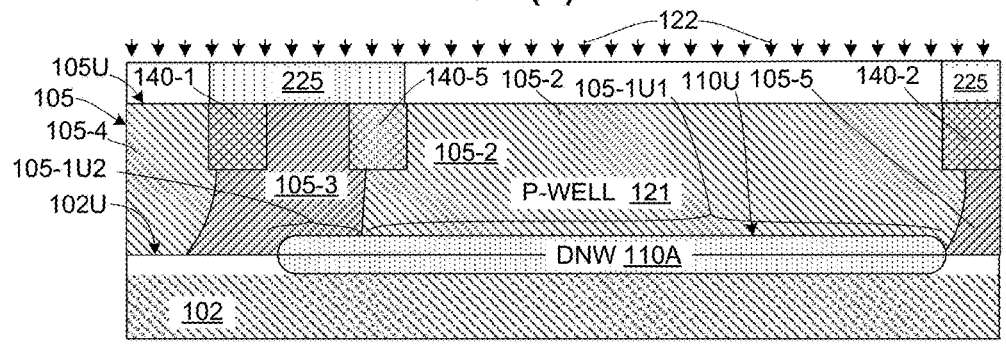

FIG. 4(C) depicts subsequent implant and thermal diffusion of P-type dopant 122 in selected portions of epitaxial layer 105. A mask 225 is formed over selected regions of upper epi surface 105U (e.g., such that mask material cover epi regions 105-3 and 105-5, and openings in the mask material expose epi regions 105-2 and 105-4). P-type dopant 122 is then implanted using a high energy process such that exposed portions of epitaxial layer 105 are subjected to P-type doping. Specifically, P-type dopant 122 is implanted through the opening in mask 225 into epi region 105-2 and then a thermal diffusion process is performed, whereby P-type dopant 122 diffuses throughout epi region 105-2 such that P-Well 121 extends from upper epi surface 105U to upper boundary 110U of Deep N-Well 110 (i.e., such that a lower boundary of P-Well 121 abuts a first upper boundary region 105-1U1 of first epitaxial layer portion 105-1, which forms a portion of Deep N-Well 110A). The portion of P-type dopant 122 implanted into epi region 105-4 similarly diffuses to form a "body" portion of the P-Tap element mentioned above, thereby providing a conductive contact from upper epi surface 105U to upper surface 102U of substrate 102. According to an aspect of the invention, the implant of P-type dopant 122 is controlled such that the masked epitaxial regions (e.g., epi regions 105-3 and 105-5) remain substantially unchanged from their intrinsic state (i.e., these regions maintain the intrinsic N-type doping concentration provided at the formation of epitaxial layer 105). Because Deep N-Well 110 extends under epi region 105-3, a second upper boundary region 105-1U2 of first epitaxial layer portion 105-1 is contacted by the intrinsic N-epi material disposed in epi region 105-3 after the P-Well doping process.

Figure 4D:
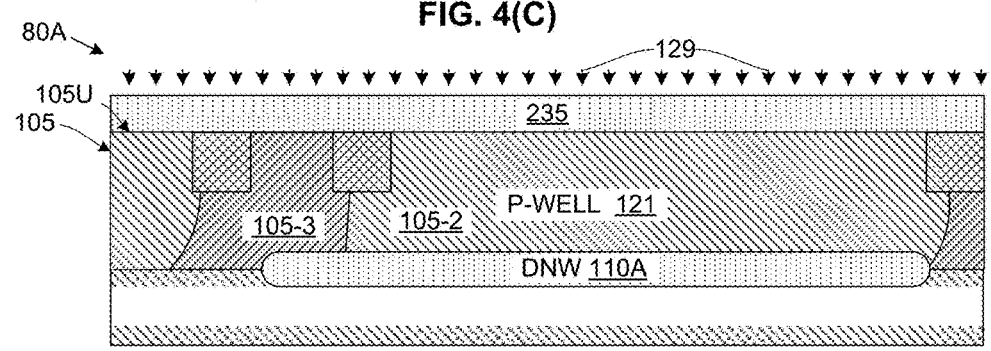

FIG. 4(D) depicts IC 80A during a subsequent high energy implant and thermal diffusion of an N-type dopant 129, which is performed as an essential process in all known CMOS and BiCMOS process flows. In particular, FIG. 4(D) depicts the omission/prevention of N-type dopant material from entering epitaxial region 105-3, which, as described below, forms part of an N-Tap element in the completed switch structure. As known in the art, the high energy implant of N-type dopants is typically utilized to generate N-Well and other N-doped regions in epitaxial layer 105 (i.e., such that these regions have a substantially higher N-doping concentration than that of the intrinsic N-epi material). In conventional bulk CMOS RF switches, the mask utilized during this high-energy N-type doping process is patterned to expose epitaxial region 105-3 such that region 105-3 attains the same N-type doping concentration as that attained by N-Well regions in other circuit elements (not shown) of IC 80A. According to an embodiment of the present invention, mask 235 is formed over the entire active switch region (i.e., such that both epitaxial regions 105-2 and 105-3 are equally protected from implanted N-type dopant 129 by mask 235), whereby mask 235 omits/prevents N-type dopant material 129 from entering epitaxial region 105-3. Accordingly, epitaxial region 105-3 is maintained as intrinsic N-epi material during the high energy implant process depicted in FIG. 4(D) (i.e., region 105-3 has essentially the same N-doping concentration after the high energy implant as before the high energy implant, and substantially the same as N-epi layer 105 immediately after its formation).

Figure 4E:
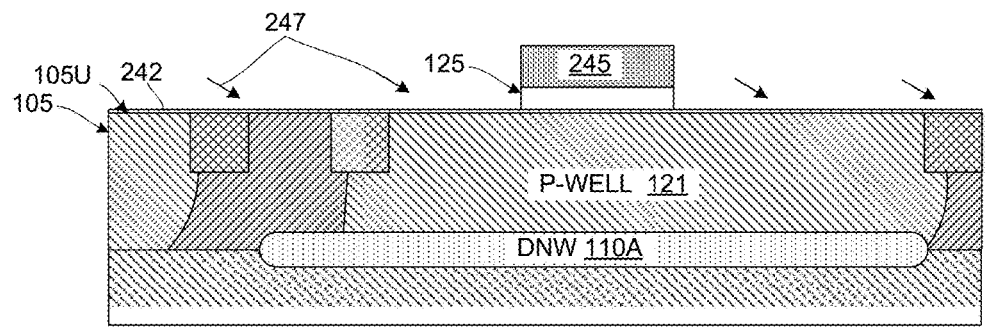

FIG. 4(E) depicts the subsequent formation of gate structure 125 over P-Well 121. Gate oxide layer 242 is then formed over upper surface 105U of epi layer 105, then a layer of polysilicon is deposited, then a mask 245 is patterned over the polysilicon, and then a suitable etchant 247 is used to remove exposed portions of the polysilicon layer, leaving behind gate structure 125. Other polysilicon patterning processes known in the art may be utilized in place of the process depicted in FIG. 4(E).

Figure 4F:
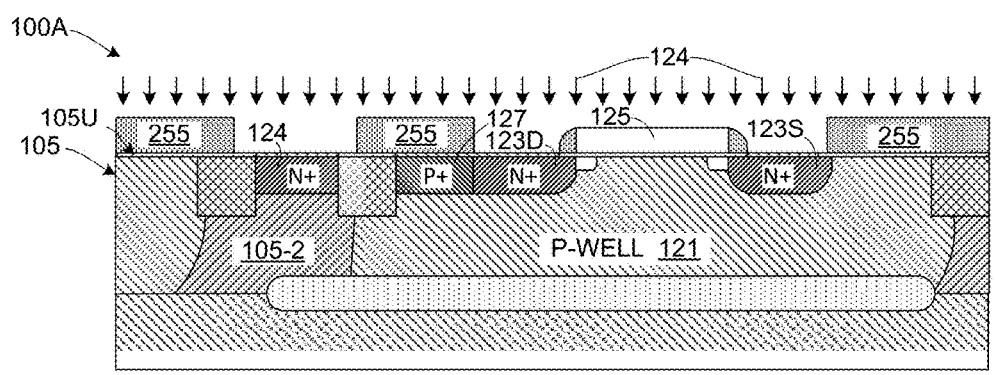

FIG. 4(F) depicts the subsequent formation of contact implants in epitaxial layer 105 using conventional CMOS front-end and back-end processes. First, shallow source/drain extension implants are formed in P-Well 121 by way of an N-type implant process to create lightly doped source extension regions on opposite sides of gate structure 125. Dielectric sidewall spacers are then formed on opposing sides of gate structure 125. A P-implant mask (not shown) is then deposited and patterned to expose a portion of P-Well 121 adjacent to intermediate peripheral field isolation section 140-5, and then a P+ surface implant process (not shown) is performed to create P-type contact implant 127. The P-implant mask is then removed, an N-implant mask 255 is deposited and patterned as indicated in FIG. 4(F), and then N-type dopant 124 is implanted by way of an N+ surface implant to create N-type source diffusion 123S and N-type drain diffusion 123D in P-Well 121 (i.e., on opposite sides of gate structure 125), and to create a shallow (third) N+ contact diffusion 124 in epi region 105-3 adjacent to upper epi surface 105U. N-implant mask 255 is subsequently removed.

Figure 4G:
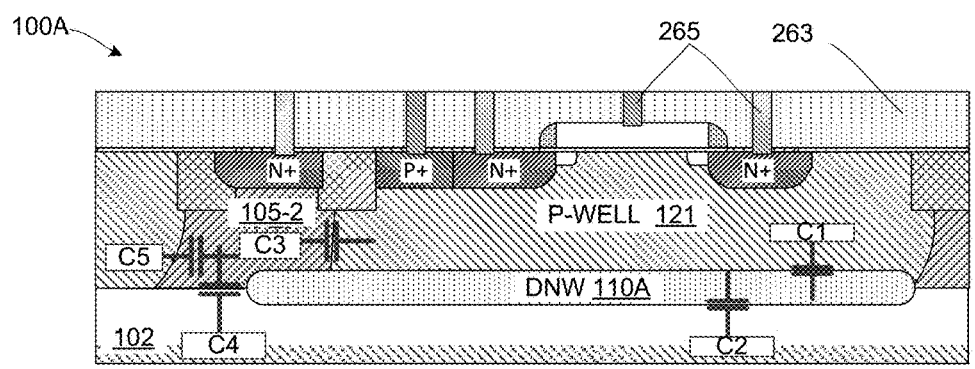

Substantially completed bulk CMOS RF switch 100A is shown FIG. 4(G). After removing exposed portions of the gate oxide, metal salicide regions are formed over contact diffusions 123S, 123D, 127 and 134 and over gate structure 125 using a conventional salicide process. A standard CMOS backend processing is then used to form the remaining backend structures (e.g., pre-metal dielectric layer 263 and metal via structures 265). Subsequent metallization providing contact between the various diffusions and control circuitry (e.g., control circuit 160 shown in FIG. 1) are omitted for the sake of brevity.

Figure 5A:
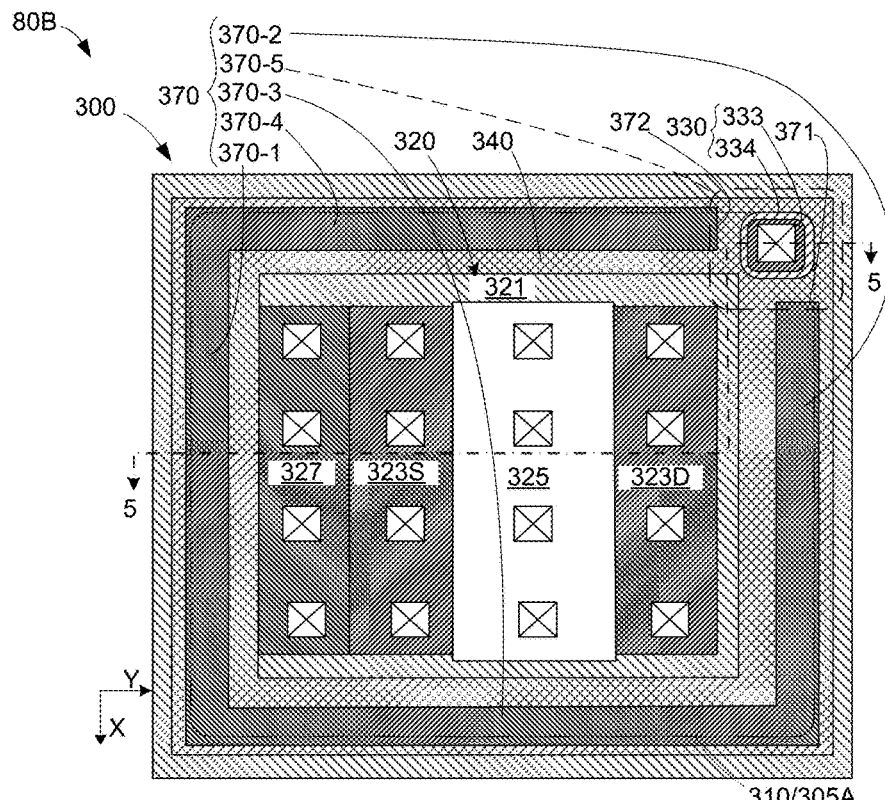
FIGS. 5(A) and 5(B) are simplified top and cross-sectional side views showing a bulk CMOS RF switch according to another embodiment of the present invention.
Figure 5B:
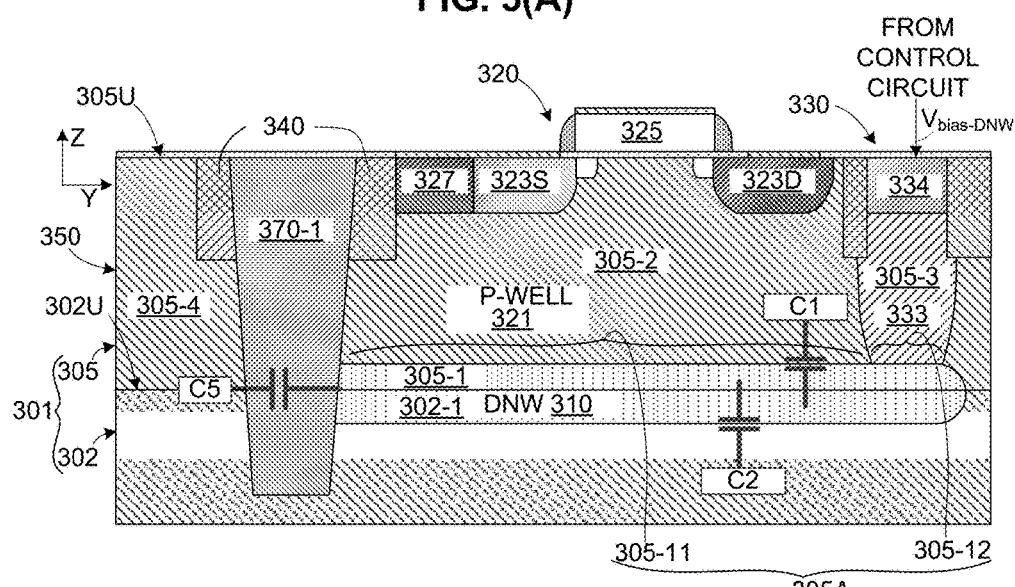

FIGS. 5(A) and 5(B) are simplified top and cross-sectional side views showing an IC 80B including a bulk CMOS RF switch 300 that utilizes a reduced-size N-Tap element 330 and an open-ring deep trench isolation structure 370 to reduce lateral parasitic capacitances according to another exemplary embodiment of the present invention.

IC 80B is fabricated on a base structure 301 including an epitaxial layer 305 formed on an upper surface 302U of a semiconductor substrate 302 such that an upper epitaxial surface 305U of epitaxial layer 305 faces away from substrate 302. Bulk CMOS RF switch 300 is formed on an active switch region 305A (i.e., in and over corresponding regions of epitaxial layer 305) that is located inside open-ring isolation structure 370). Similar to the earlier embodiment, switch 300 includes a Deep N-Well 310 disposed at an interface between epitaxial layer 305 and substrate 102, a transistor element 320 including functional switch elements (e.g., N+ source diffusion 323S, N+ drain diffusion 323D, polysilicon gate structure 325 and P+ body diffusion 327) disposed on a P-Well 321 in a manner similar to that described above, and an N-Tap element 330 that functions to transmit a bias voltage to Deep N-Well 310. Deep N-Well 310 is formed by an N-type dopant diffused into a first epitaxial layer portion 305-1 and a first region 302-1 of substrate 102. P-Well 321 is formed by a P-type dopant disposed in a second epitaxial region 305-2 that is entirely located over a first portion 305-11 of first epitaxial region 305-1 (i.e., P-Well is entirely separated from upper surface 302U of substrate 302 by the portion of Deep N-Well 310 that is formed in first epitaxial layer portion 305-1).

Referring to FIG. 5(A), open-ring isolation structure 370 includes contiguous deep trench isolation sections 370-1 to 370-4 that are configured to extend around active switch region 305A and, as indicated in FIG. 5(B), to extend entirely through epitaxial layer 305 (i.e., from upper epitaxial surface 305U into semiconductor substrate 302). In the disclosed embodiment, the contiguous deep trench isolation sections includes opposing parallel (first and second) end sections 370-1 and 370-2 and opposing parallel (first and second) side sections 370-3 and 370-4 that are collectively configured in a three-cornered rectangular arrangement, where the intersection of first end section 370-1 and first side section 370-3 forms a first closed corner, the intersection of first end section 370-1 and second side section 370-4 forms a second closed corner, and the intersection of second end section 370-2 and second side section 370-4 forms a third closed corner. Open-ring isolation structure 370 also includes opposing end portions 371 and 372 that define a gap region 370-5 therebetween, where gap region 370-5 effectively forms an open corner of the three-cornered rectangular arrangement.

Referring to the upper right portion of FIG. 5(A) and to the corresponding portion of FIG. 5(B), N-Tap element 330 is disposed in gap region 370-5 and includes a body portion 333 formed by an N-type dopant disposed in a (third) epitaxial region 305-3 located over a second portion 305-12 first epitaxial region 105-1, and an N+ contact diffusion 334 formed at the upper end of body portion 333. Body portion 333 includes an N-type dopant that is intrinsic to or diffused into epitaxial region 305-3 such that N-Tap element 330 is configured to form a conductive path between N+ contact diffusion 334 (i.e., upper epitaxial surface 305U) and a corner of Deep N-Well 310, whereby a potential of Deep N-Well 310 is controlled by a bias voltage supplied from a control circuit (not shown) during operation of switch 300. In a presently preferred embodiment, N-Tap element 330 is configured with a reduced size in order to fit within gap region 370-5, and body portion 333 is formed using a high-energy N-type implant process utilized to form N-type body regions in other circuit elements (not shown) of IC 80B. In contrast, P-Well 321 occupies a majority of the active switch region 305A surrounded by open-ring isolation structure 370 (i.e., as indicated in FIG. 5(A), P-Well 321 extends the entire length between first side section 370-1 and second side section 370-2, and extends from end section 370-1 to at least a portion of said second epitaxial region 305-2, and is only omitted adjacent to gap region 370-5).

As indicated in FIG. 5(B), the deep-trench isolation of open-ring isolation structure 370 and the reduced size of N-Tap element 330 combine to significantly reduce lateral P-N junction parasitic capacitances, thereby reducing the total parasitic capacitance (i.e., in comparison to convention bulk CMOS RF switches) of bulk CMOS RF switch 300. Electrical connection to Deep N-Well 310 is maintained by way of gap (open) region 370-5, which allows N-tap element 330 to connect down to Deep N-Well 310. In this case vertical parasitic capacitances C1 and C2 remain unchanged from the conventional case, but lateral parasitic capacitances C3 and C4 are essentially eliminated, and only lateral parasitic capacitance C5 between Deep N-Well 310 and P-Tap 350 and P-type substrate 302 remains significant. A further advantage of this technique is that it allows closer packing of adjacent switches since the region between them no longer needs to be extended to reduce the lateral P-N junction capacitances.

Figure 6:
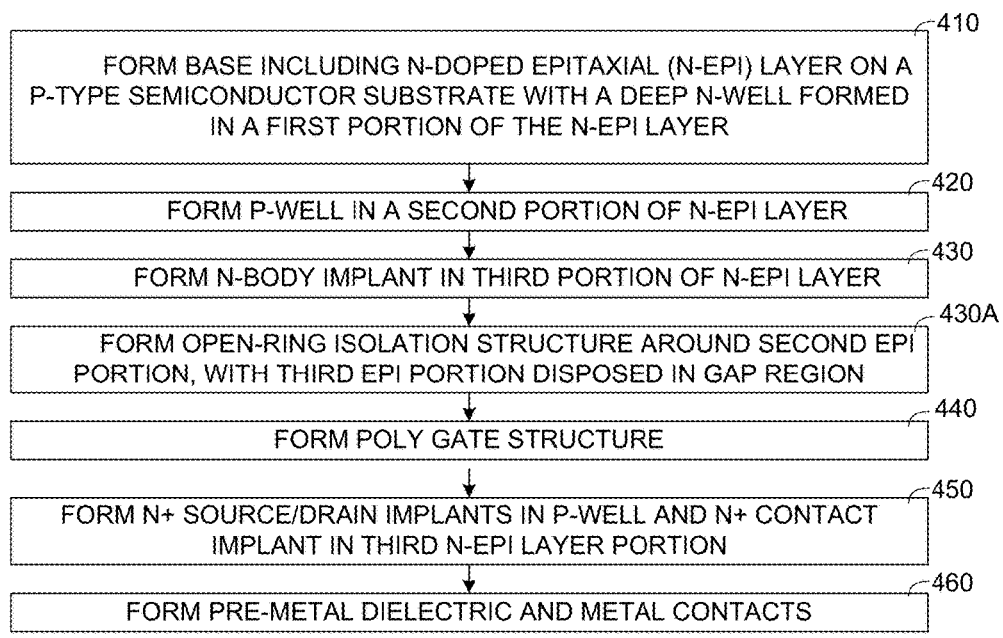
FIG. 6 is a flow diagram showing a method for producing the bulk CMOS RF switch of FIGS. 5(A) and 5(B) according to another embodiment of the present invention.
Figure 7A:
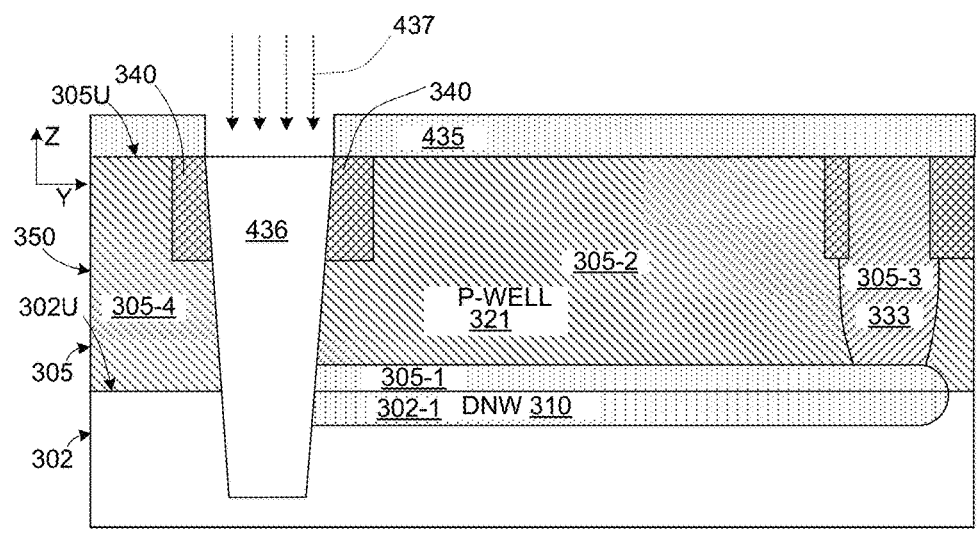
FIGS. 7(A) and 7(B) are simplified cross sectional views showing the bulk CMOS RF switch of FIGS. 5(A) and 5(B) during fabrication in accordance with the methodology of FIG. 6.
Figure 7B:
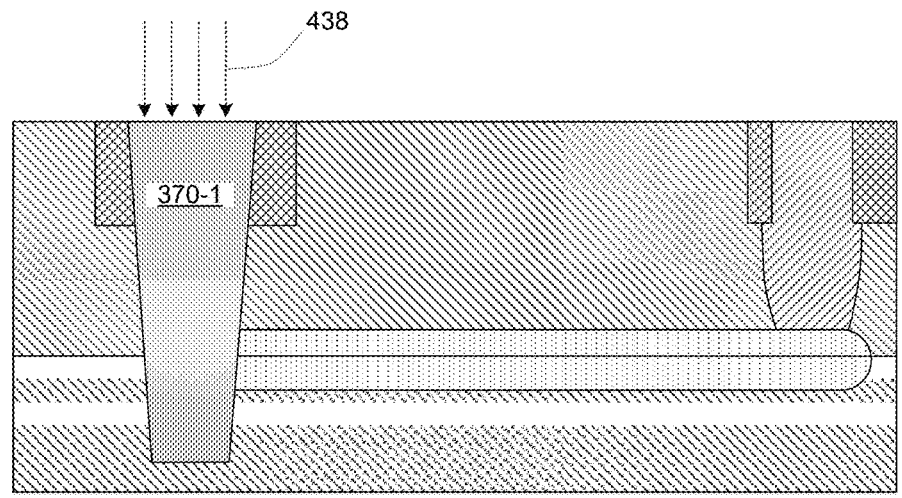

FIG. 6 is a flow diagram showing a method for fabricating bulk CMOS RF switch 300. Similar to the process described earlier, the method includes forming (block 410) base structure 301 with Deep N-well 310 formed in first epi region 305-1, then (block 420) forming P-well 321 in second epi region 305-2. Referring to block 430, according to the preferred embodiment, diffusion of high-energy (body) N-type implant is performed in third epitaxial region 305-3, with third epitaxial region 305-3 being positioned in the manner described above (i.e., over a corner region of Deep N-Well 310 when viewed from the top, e.g., as shown in FIG. 5(A)). Next (block 430A), open-ring DT isolation structure 370 is formed using known techniques that are depicted in FIGS. 7(A) and 7(B). Referring to FIG. 7(A), a mask 435 is formed over upper epi surface 305U, and then trenches 436 are etched through epitaxial layer 305 and into substrate 302 using a suitable etchant 437. As indicated in FIG. 7(B), the trenches are then filled with a suitable dielectric material 438, thereby completing formation of the DT sections (e.g., section 370-1). Referring again to FIG. 6, polysilicon gate structure 325 is then formed over P-well 321 (block 440), and then N-type and P-type implants are performed (block 450), and then backend metallization (block 460) is performed as described above.

Although the invention has been described in connection with several embodiments, it is understood that this invention is not limited to the embodiments disclosed, but is capable of various modifications, which would be apparent to a person skilled in the art. For example, the conductivity types (i.e., N-type or P-type) of the various semiconductor regions can be reversed with similar results. Thus, the invention is limited only by the following claims.

We claim:

1. An integrated circuit comprising:
a base structure including an epitaxial layer formed on an upper surface of a semiconductor substrate, and
at least one bulk CMOS RF switch formed in an active switch area of the base structure, said at least one bulk CMOS RF switch including:
a Deep N-Well including a first N-type dopant at least partially disposed in a first epitaxial region of the epitaxial layer, said Deep N-well having a nominal concentration of said N-type dopant in the range of $1 \times 10^{16}$ to $1 \times 10^{18}$ atoms per cubic centimeter;
a transistor element including:
a P-Well including a first P-type dopant disposed in a second epitaxial region such that said P-Well is entirely located over a first epitaxial layer portion of the first epitaxial region,
spaced-apart N-type source and drain contact diffusions formed by a second N-type dopant disposed in the P-Well adjacent to the upper epitaxial surface such that a channel region is formed by a portion of the P-Well located between the source and drain contact diffusions, and
a gate structure located over the channel region; and an N-Tap element comprising a body region formed by a third epitaxial region of said epitaxial layer that is at least partially located over a second epitaxial region portion of the first epitaxial region, said N-Tap element also including a third N-type contact diffusion formed by said second N-type dopant and disposed in the third epitaxial region adjacent to the upper epitaxial surface, wherein the body region comprises intrinsic epitaxial material having a resistivity in the range of 0.5 to 2ohm-cm, and wherein said N-Tap element is configured such that said third N-type contact diffusion is separated from a second upper boundary region of the second epitaxial layer portion by said intrinsic epitaxial material forming said body region.

2. The integrated circuit of claim 1, further comprising a control circuit configured to transmit a first bias voltage to the third N-type contact diffusion, wherein the body region of the N-Tap element is configured to pass at least a portion of said first bias voltage from the third N-type contact diffusion to the Deep N-Well such that the Deep N-Well is maintained at a predetermined first bias voltage level during operation of said transistor element.

3. The integrated circuit of claim 2, further comprising a P-type body contact diffusion formed by a second P-type dopant disposed in the P-Well adjacent to the upper epitaxial surface,
wherein said control circuit is further configured to transmit a second bias voltage to said P-type body contact diffusion, whereby the second bias voltage maintains the P-Well at a predetermined second bias voltage level during operation of said transistor element.

4. The integrated circuit of claim 1, further comprising a plurality of peripheral field isolation sections surrounding said active switch area, and an intermediate field isolation section extending between the P-Well and the N-Tap element.

5. The integrated circuit of claim 4, further comprising a P-Tap element including said first P-type dopant disposed in a fourth epitaxial region of said epitaxial layer outside of said plurality of peripheral field isolation sections, wherein said P-Tap element extends entirely through said epitaxial layer from said upper epitaxial surface to said upper surface of the semiconductor substrate.

6. An integrated circuit comprising:
a base structure including an epitaxial layer formed on an upper surface of a semiconductor substrate, said epitaxial layer having an upper epitaxial surface that faces away from the semiconductor substrate;
at least one bulk CMOS RF switch formed on an active switch region of the base structure, said at least one bulk CMOS RF switch including:
a Deep N-Well at least partially disposed in a first epitaxial layer portion of the epitaxial layer;
a transistor element including functional switch elements disposed on a P-Well, said P-Well being disposed in a second epitaxial region located over a first portion of the first epitaxial region such that said P-Well is separated from said substrate by said Deep N-Well; and
an N-Tap element including a body portion disposed in a third epitaxial region located over a second portion the first epitaxial region, said N-Tap element being configured to form a conductive path between said upper epitaxial surface and said Deep N-Well; and
an open-ring isolation structure comprising a plurality of contiguous deep trench isolation sections extending around the active switch region, said open-ring isolation structure including opposing end portions defining a gap region therebetween, wherein said N-Tap element is disposed in said gap region of said open-ring isolation structure.

7. The integrated circuit of claim 6, wherein said open-ring isolation structure includes opposing parallel first and second end sections and opposing parallel first and second side sections that are collectively configured in a three-cornered rectangular arrangement including three closed corners and one open corner, and wherein said N-Tap element is disposed in said open corner of said three-cornered rectangular arrangement.

8. The integrated circuit of claim 7, wherein each of said first and second end sections and each of said first and second side sections extend entirely through the epitaxial layer from the upper epitaxial surface and into the semiconductor substrate.

9. The integrated circuit of claim 7, wherein said P-Well extends between said first and second side sections of said open-ring isolation structure and extends from said first end section to at least a portion of said second epitaxial region, whereby said P-Well occupies a majority of the active switch region.

* * * * *